United States Patent
Sakamoto et al.

(10) Patent No.: US 8,344,356 B2
(45) Date of Patent: Jan. 1, 2013

(54) SEMICONDUCTOR MATERIAL, METHOD OF MAKING THE SAME, AND SEMICONDUCTOR DEVICE

(75) Inventors: Ryo Sakamoto, Akita (JP); Jo Shimizu, Akita (JP); Tsuneo Ito, Akita (JP); Takashi Egawa, Nagoya (JP)

(73) Assignees: Dowa Electronics Materials Co., Ltd., Tokyo (JP); National University Corporation Nagoya Institute of Technology, Nagayo (JP)

( * ) Notice: Subject to any disclaimer, the term of this patent is extended or adjusted under 35 U.S.C. 154(b) by 305 days.

(21) Appl. No.: 12/735,259

(22) PCT Filed: Dec. 17, 2008

(86) PCT No.: PCT/JP2008/072911
§ 371 (c)(1),
(2), (4) Date: Sep. 17, 2010

(87) PCT Pub. No.: WO2009/084431
PCT Pub. Date: Jul. 9, 2009

(65) Prior Publication Data
US 2011/0001127 A1    Jan. 6, 2011

(30) Foreign Application Priority Data
Dec. 27, 2007 (JP) ................................. 2007-337167

(51) Int. Cl.
*H01L 296/06* (2006.01)
(52) U.S. Cl. ........... 257/22; 257/E33.033; 257/E33.034; 438/478
(58) Field of Classification Search ............... 257/22, 257/E33.033, E33.034
See application file for complete search history.

(56) References Cited

U.S. PATENT DOCUMENTS

| | | | |
|---|---|---|---|
| 7,619,238 B2 * | 11/2009 | Gaska et al. | 257/14 |
| 2001/0028668 A1 | 10/2001 | Fukunaga et al. | |
| 2007/0045639 A1 | 3/2007 | Kato et al. | |

FOREIGN PATENT DOCUMENTS

| | | |
|---|---|---|
| JP | A-2001-230447 | 8/2001 |
| JP | A-2001-358407 | 12/2001 |
| JP | A-2004-524250 | 8/2004 |
| JP | A-2006-222191 | 8/2006 |
| JP | A-2007-67077 | 3/2007 |
| JP | A-2007-88426 | 4/2007 |
| JP | A-2007-258230 | 10/2007 |
| WO | WO 02/48434 A2 | 6/2002 |

OTHER PUBLICATIONS

Mar. 17, 2009 Search Report issued in International Patent Application No. PCT/JP2008/072911 (with translation).

* cited by examiner

*Primary Examiner* — Zandra Smith
*Assistant Examiner* — Paul Patton
(74) *Attorney, Agent, or Firm* — Oliff & Berridge, PLC

(57) ABSTRACT

A semiconductor material is provided comprising: a composition graded layer, formed on a Si substrate or an interlayer formed thereon, comprising a composition of $Al_xGa_{1-x}N$ graded such that a content ratio of Al in the composition decreases continuously or discontinuously in a crystal growing direction; a superlattice composite layer, formed on the composition graded layer, comprising a high Al-containing layer comprising a composition of $Al_yGa_{1-y}N$ and a low Al-containing layer comprising a composition of $Al_zGa_{1-z}N$ that are laminated alternately; and a nitride semiconductor layer formed on the superlattice composite layer.

11 Claims, 5 Drawing Sheets (a)

(b)

(a)

(b)

SEMICONDUCTOR MATERIAL, METHOD OF MAKING THE SAME, AND SEMICONDUCTOR DEVICE

TECHNICAL FIELD

The present invention relates to a semiconductor material, used for a semiconductor device such as, for example, a light-emitting diode (LED), a field-effect transistor (FET) and the likes, capable of inhibiting generations of a crack and a pit in particular and having an excellent crystal quality, to a method of making the semiconductor material, and to a semiconductor device.

BACKGROUND ART

A nitride semiconductor, as an active material for an electronic device such as the field-effect transistor and the likes and for a light-emitting device in a short-length region from a visible light region to an ultraviolet light region, has been actively studied and technically developed in recent years.

In general, a nitride semiconductor is formed on a substrate comprising SiC, Si and the likes. A Si substrate in particular has a numerous advantages such as having availability for a large dimension thereof at a low cost, an excellent crystalline property and radiation performance, as well as easy cleavage and etching and a mature process technique.

However, since a lattice constant and a coefficient of thermal expansion are significantly different between the nitride semiconductor and the Si substrate, there has been a problem that, if the nitride semiconductor is grown on the Si substrate, a grown-up nitride semiconductor causes the crack and the pit (a point-like defect). Since the crack and the pit result in a leak current which seriously affects a device property, it is an important issue to prevent occurrence thereof.

As a method to solve the above problem, there is known an art to prevent the crack by forming a buffer layer between the Si substrate and a nitride semiconductor layer. As disclosed in Patent Document 1, for example, there is the semiconductor material in which an interlayer comprising the nitride semiconductor is provided on the Si substrate and a buffer layer comprising compositionally graded $Al_XGa_{1-X}N$ and the likes, and gallium nitride is formed on a transition layer.

As another method to solve the above problem, there is known an art such as, as disclosed in Patent Document 2, a nitride semiconductor device in which an AlN-based superlattice composite layer comprising a plurality of a high Al-containing layer and a low Al-containing layer laminated alternately is formed on the Si substrate and the nitride semiconductor layer is formed on the buffer layer, the AlN-based superlattice composite layer.

However, although being effective in preventing the clack generated in the nitride semiconductor layer, the semiconductor materials alone described in Patent Document 1 and Patent Document 2 do not have sufficient effect to prevent generation of the pit and are incapable of preventing degradation of the device property caused by generation of the pit. In addition, when the semiconductor material is used for a power device usage, the nitride semiconductor layer needs to have a thick film, as a high pressure resistance is required. Therefore, it is desired to improve the crystalline property of the nitride semiconductor, although the semiconductor material in Patent Document 2 does not have an effect to improve the crystalline property.

Patent Document 1: Japanese Patent Application Laid-Open No. 2004-524250

Patent Document 2: Japanese Patent Application Laid-Open No. 2007-67077

DISCLOSURE OF THE INVENTION

Problems to be Solved by the Invention

It is an object of the present invention to provide the semiconductor material, having an nitride semiconductor layer which generates less crack and pit and has an excellent crystalline property, by forming a predetermined buffer layer between an Si substrate or an interlayer formed thereon and a nitride semiconductor layer, a method of making such a semiconductor material, and a nitride semiconductor device.

In order to achieve the above object, a summary of the present invention is configured as follows.

(1) A semiconductor material is characterized in comprising: a composition graded layer, formed on the Si substrate or the interlayer formed thereon, comprising a composition of $Al_XGa_{1-X}N$ graded such that a content ratio of Al in the composition decreases either continuously or discontinuously in a crystal growing direction; a superlattice composite layer, formed on the composition graded layer, comprising a high Al-containing layer comprising a composition of $Al_YGa_{1-Y}N$ ($0.5 \leq Y \leq 1$) and a low Al-containing layer comprising a composition of $Al_ZGa_{1-Z}N$ ($0 \leq Z \leq 0.5$) that are laminated alternately; and the nitride semiconductor layer formed on the superlattice composite layer.

(2) The semiconductor material described in the above (1) is characterized in that the superlattice composite layer comprises an AlN layer (Y=1) as the high Al-containing layer and an $Al_ZGa_{1-Z}N$ layer ($0 \leq Z \leq 0.3$) as the low Al-containing layer.

(3) The semiconductor material described in the above (1) or (2) is characterized in that a total number of the high Al-containing layer and the low Al-containing layer is 2 to 100 in the superlattice composite layer.

(4) The semiconductor material described in the above (1), (2) or (3) is characterized in that the superlattice composite layer comprises the high Al-containing layer as a bottom layer thereof and the low Al-containing layer as the top layer.

(5) The semiconductor material described in one of the above (1) to (4) is characterized in that, in the graded layer, a value of X in $Al_XGa_{1-X}N$ is in a range of 0.5 to 1 at a lower surface in contact with the Si substrate or the interlayer and in a range of 0 to 0.5 at an upper surface in contact with the superlattice composite layer.

(6) The semiconductor material described in one of the above (1) to (5) is characterized in that the nitride semiconductor layer is a GaN layer.

(7) The semiconductor material described in the above (6) is characterized in that a pit density of the GaN layer is 1000 pits/cm² or less.

(8) A semiconductor device comprising the semiconductor material described in one of the above (1) to (7) provided with an electrode.

(9) A method of making a semiconductor material is characterized in: forming a composition graded layer, on a Si substrate or an interlayer formed on the Si substrate, comprising a composition of $Al_XGa_{1-X}N$ graded such that a content ratio of Al in the composition decreases either continuously or discontinuously in a crystal growing direction; forming a superlattice composite layer, on the composition graded layer, comprising a high Al-containing layer comprising a composition of $Al_YGa_{1-Y}N$ ($0.5 \leq Y \leq 1$) and a low Al-containing layer comprising a composition of $Al_ZGa_{1-Z}N$ ($0 \leq Z \leq 0.5$) that are laminated alternately; and forming the nitride semiconductor layer on the superlattice composite layer.

(10) The method of making the semiconductor material described in the above (9) is characterized in that a process to form the superlattice composite layer is to form an AlN layer as the high Al-containing layer and to form an $Al_ZGa_{1-Z}N$ layer ($0 \leq Z \leq 0.3$) as the low Al-containing layer.

(11) The method of making the semiconductor material described in the above (9) or (10) is characterized in that the process to form the superlattice composite layer is to laminate the high Al-containing layer and the low Al-containing layer such that a total number thereof is 2 to 100.

According to the present invention, as the buffer layer to prevent generation of the crack and the likes, the composition graded layer is formed comprising a composition of $Al_XGa_{1-X}N$ graded such that the content ratio of Al in the composition decreases continuously or discontinuously in the crystal growing direction and also the superlattice composite layer is formed comprising the high Al-containing layer comprising the composition of $Al_YGa_{1-Y}N$ ($0.5 \leq Y \leq 1$) and the low Al-containing layer comprising the composition of $Al_ZGa_{1-Z}N$ ($0 \leq Z \leq 0.5$) are laminated alternately. Thereby, it provides the semiconductor material having the nitride semiconductor layer which generates less crack and pit in comparison with a conventional semiconductor material and has an excellent crystalline property, the method of making the semiconductor material and the semiconductor device.

DESCRIPTION OF EMBODIMENTS

Figure 1:
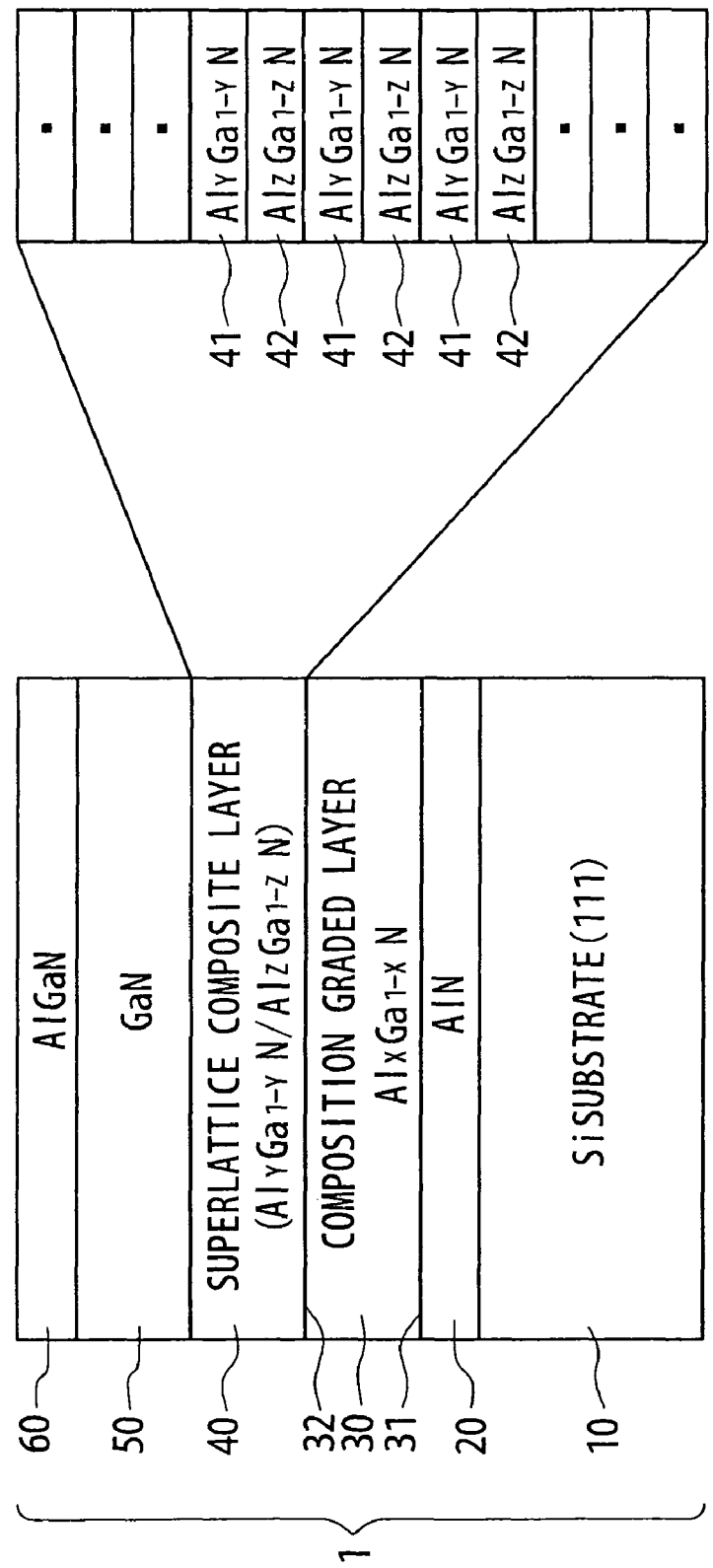
FIG. 1 is a cross sectional view of a semiconductor material according to the present invention.

Preferred embodiments of the present invention will be described as follows, with reference to the accompanying drawings. FIG. 1 is a diagram exemplifying a side view of a semiconductor material 1 according to the present invention.

The semiconductor material 1 according to the present invention, as shown in FIG. 1, comprises a composition graded layer 30 formed on a Si substrate 10 or an interlayer 20 formed thereon comprising a composition of $Al_XGa_{1-X}N$ graded such that a content ratio of Al in the composition gradually decreases continuously or discontinuously in a crystal growing direction; a superlattice composite layer 40, formed on the composition graded layer 30, comprising a high Al-containing layer 41 comprising a composition of $Al_YGa_{1-Y}N$ and a low Al-containing layer 42 comprising a composition of $Al_ZGa_{1-Z}N$ that are laminated alternately; and a nitride semiconductor layer 50 formed on the superlattice composite layer 40.

As a result of earnest study of the semiconductor having the nitride semiconductor layer which generates less cracks and pits and has an excellent crystalline property, the present inventors found out that a layer configuration using only one of the composition graded layer 30 and the superlattice composite layer 40 as conventionally carried out cannot fulfill all functions stated above, and that it is only possible when the superlattice composite layer 40 is formed on the composition graded layer 30 that a defect leading the pit can be cut off and thus generation of the pit can be prevented, as each of the layers 30, 40 cut off a different defect while preventing generation of the crack in the same manner as conventional arts. The inventors also found out that, as a result of that each of the layers 30, 40 cut off the different defect and that a difference between a lattice constant of the Si substrate 10 and that of the nitride semiconductor layer 50 can be mitigated more, it is possible to obtain the nitride semiconductor layer 50 having an excellent crystalline property.

It is to be noted that the superlattice composite layer 40 is formed on the composition graded layer 30 in the semiconductor material 1 according to the present invention, and it cannot provide the same effect in a converse manner, that is, if the composition graded layer 30 is formed on the superlattice composite layer 40. This may be because a dislocation, a source of the pit, is regenerated within the graded composite layer and transmitted to the nitride semiconductor layer 50.

(Si Substrate and Interlayer)

The Si layer 10 according to the present invention is not particularly limited but may employ a substrate comprising single-crystal silicon which is usually employed.

A thickness of the Si substrate 10 is also not particularly limited but preferably 0.2 to 1 mm, in terms of maintaining rigidity of the substrate and a heat radiation effect of a device.

Moreover, according to the present invention, an interlayer 20 can be formed on the Si substrate if necessary, as shown in FIG. 1. Formation of the interlayer 20 provides an effect to further decrease a stress of the nitride semiconductor 50 and another effect to enable to have a smaller film thickness of the composition graded layer 30 and the superlattice position layer 40 as a buffer layer.

A composition of the interlayer 20 is not particularly limited as long as having a buffering effect for the Si substrate 10 and the nitride semiconductor layer 50, and may be AlN, GaN, $Al_XIn_YN$, $In_XGa_{1-X}N$ or $Al_XIn_YGa_{1-X-Y}$ and the likes. However, it is preferable to use a layer comprising AlN, as Si and Ga easily react one another causing a difficulty in obtaining a crystal with a good quality.

(Composition Graded Layer)

The composition graded layer 30 according to the present invention, as shown in FIG. 1, comprises a composition of $Al_XGa_{1-X}N$ graded such that the content ratio of Al decreases (gradually decreases) continuously or discontinuously in a crystal growing direction L. As the composition is graded such that the content ratio of Al gradually decreases in the crystal growing direction L, a coefficient of thermal expansion of the $Al_XGa_{1-X}N$ approximates that of Si at a lower surface 21 in contact with the substrate 10 and approximates that of the nitride semiconductor layer at an upper layer 22 in contact with the superlattice composite layer 40. Thereby, an internal stress of the nitride semiconductor layer 50 is decreased, leading to prevention of generation of the crack.

A value of X of the $Al_xGa_{1-x}N$ in the graded layer 30 is preferably in a range of 0.5 to 1 at the lower surface 21 and in a range of 0 to 0.5 at the upper surface 22. With the value of X in these ranges at the lower surface 21 and the upper surface 22, it mitigates difference between the lattice constant of the Si substrate 10 and that of the composite graded layer 30 and, as a result, improves the crystalline property of the nitride semiconductor layer 50. In addition, it is more preferable that the lower surface 21 has a composition of AlN and the upper surface 22a has a composition of GaN.

Moreover, the content ratio (X) of Al of $Al_xGa_{1-x}N$ of the composition graded layer 30 may be either continuous or discontinuous as long as it decreases in the crystal growing direction L. In addition, the content ratio can gradually decreases at either constant or inconstant ratio.

Furthermore, a film thickness of the composition graded layer 30 is preferably 1 to 10 μM. If the film thickness is less than 1 μm, the internal stress of the nitride semiconductor layer 50 may not be sufficiently decreased, whereas, if the film thickness is over 10 μm, a wafer warps more because of a difference between the coefficients of thermal expansion of the composition graded layer and that of the Si substrate.

(Superlattice Composite Layer)

The superlattice composite layer 40 according to the present invention, as shown in FIG. 1, is formed on the composition graded layer 30 and is a composite layer which comprises the high Al-containing layer 41 comprising a composition of $Al_YGa_{1-Y}N$ ($0.5 \leq Y \leq 1$) and the low Al-containing layer 42 comprising a composition of $Al_ZGa_{1-Z}N$ ($0 \leq Z \leq 0.5$) that are laminated alternately. By forming the superlattice composite layer 40, it is possible to mitigate the differences of the lattice constants and the coefficients of thermal expansion between the Si substrate 10 and the nitride semiconductor layer 50 and, as a result, to prevent generation of the crack in the nitride semiconductor layer 50. Moreover, by forming the superlattice composite layer 40 on the composition graded layer 30 as described above, it also provides an effect to prevent generation of the pit in the nitride semiconductor layer 50.

Also, it is preferable that the superlattice composite layer 40 comprises an AlN layer as the high Al-containing layer 41 and an $Al_ZGa_{1-Z}N$ ($0 \leq Z \leq 0.3$) layer as the low Al-containing layer 42. Having AlN as the high Al-containing layer 41, the coefficient of thermal expansion and the lattice constant approximate those of the Si substrate 10, which leads to an effect as the buffer layer. This is also because, if a value of Z of the low Al-containing layer 42 exceeds 0.3, a difference between a deemed lattice constant at an end of the composition graded layer 30 and the nitride semiconductor 50 and that of the entire superlattice composite layer becomes large, which results in increase of the pits and generation of the crack in the nitride semiconductor layer 50. In addition, when the value of Z is in a range of 0.1 to 2.0, optimally 0.15, it provides an even better effect.

Figure 2:
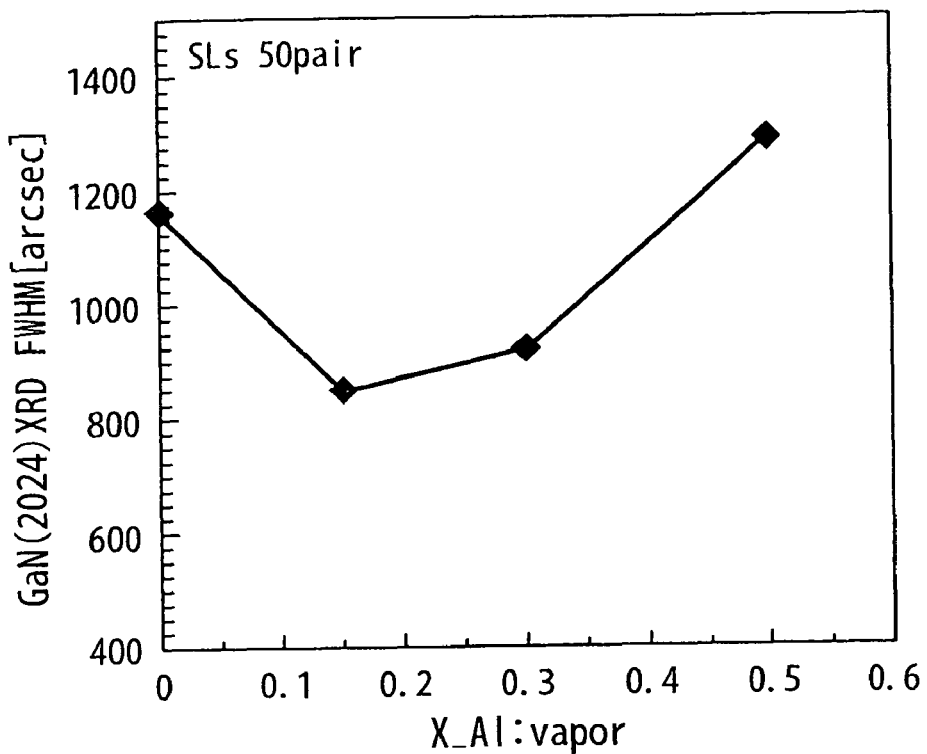
FIG. 2 is graphs illustrating a relationship between a content ratio of Al (Z=0, 0.15, 0.3, 0.5) of a low Al-containing layer ($Al_ZGa_{1-Z}N$ layer) and a quality of a GaN layer: (a) illustrates a relationship between the content ratio of Al of the low Al-containing layer and a half bandwidth of an X-ray diffraction of the GaN layer, and (b) illustrates a relationship between the content ratio of Al of the low Al-containing layer and the number of pits generated in a unit dimension of the GaN layer.
Figure 2:
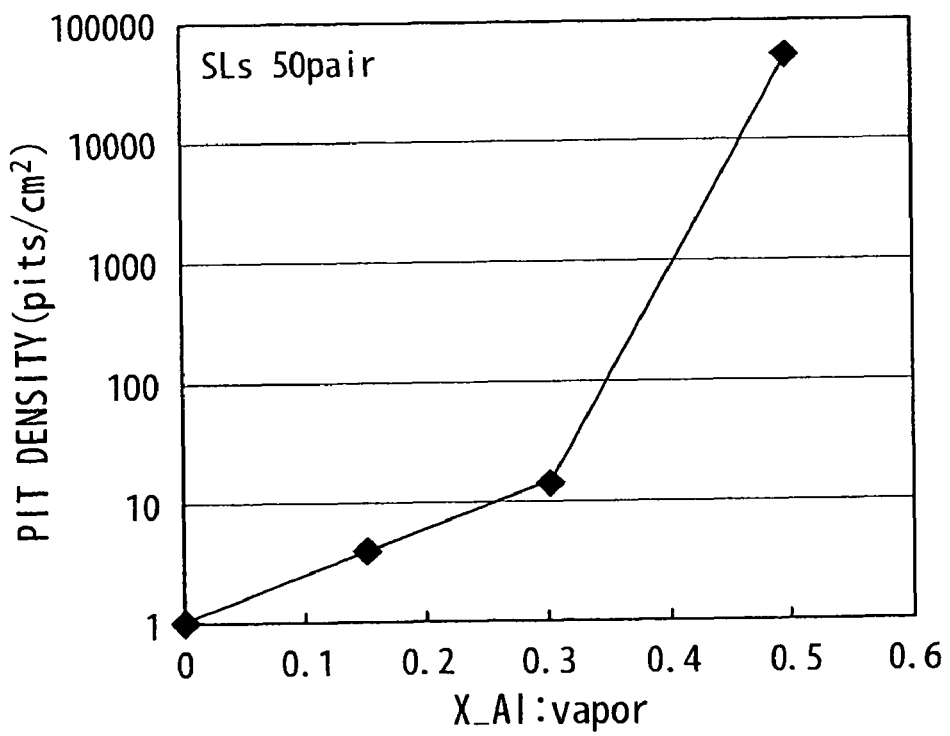

Here, FIG. 2(a) is a graph showing a relationship between the value of Z of the low Al containing layer 42 and the crystalline property (the half bandwidth of the X-ray diffraction) of the GaN layer, with regard to four types of the semiconductor material 1 comprising, as shown in FIG. 1: the MN layer having the film thickness of 100 nm as the interlayer 20 formed on the Si substrate 10; the composition graded layer 30, formed on the AlN layer, having the film thickness of 3.5 μm and the composition $Al_xGa_{1-x}N$ with the value of X to change continuously from X=1 to X=0; the superlattice composite layer 40, formed on the composition graded layer 30, comprising fifty AlN layers, as the high Al-containing layer 41, having the film thickness of 3.5 μm respectively and fifty $Al_ZGa_{1-Z}N$ layers of one of four types (Z=0, 0.15, 0.3 or 0.4), as the low Al-containing layer 42, having the film thickness of 20 nm respectively that are laminated alternately; and the GaN layer as the nitride semiconductor layer 50, formed on the superlattice composite layer 40, having the film thickness of 1.0 μm. FIG. 2(b) is a graph showing a relationship between the values of Z of the low Al containing layer 42 and the number of pits in the unit dimension (1 $cm^2$) of the GaN layer, with regard to such four types of the semiconductor material 1. As obvious from FIG. 2(a) and FIG. 2(b), if the value of Z of $Al_ZGa_{1-Z}N$ comprising the low Al-containing layer 42 of the superlattice composite layer 40 exceeds 0.3, the crystalline property degrades (the half bandwidth becomes large) (FIG. 2(a)), and the number of pits significantly increases (FIG. 2(b)).

In addition, it is preferable that the superlattice composite layer 40 comprises 2 to 100 layers of the high Al-containing layer 41 and the low Al-containing layer 42 in total. In order to obtain the effect according to the present invention, it is necessary to laminate at least one of each layer of the high Al-containing layer 41 and the low Al-containing layer 42, whereas the crack is easily generated in the nitride semiconductor layer 50 if the total number of the layers is over 100. Moreover, it is preferable that the superlattice composite layer 40, as shown in FIG. 1, comprises the high Al-containing layer 41 as a bottom layer thereof and the low Al-containing layer 42 as a top layer, so as to produce the effect to prevent generation of the crack and the pit in the nitride semiconductor layer 50.

Figure 3:
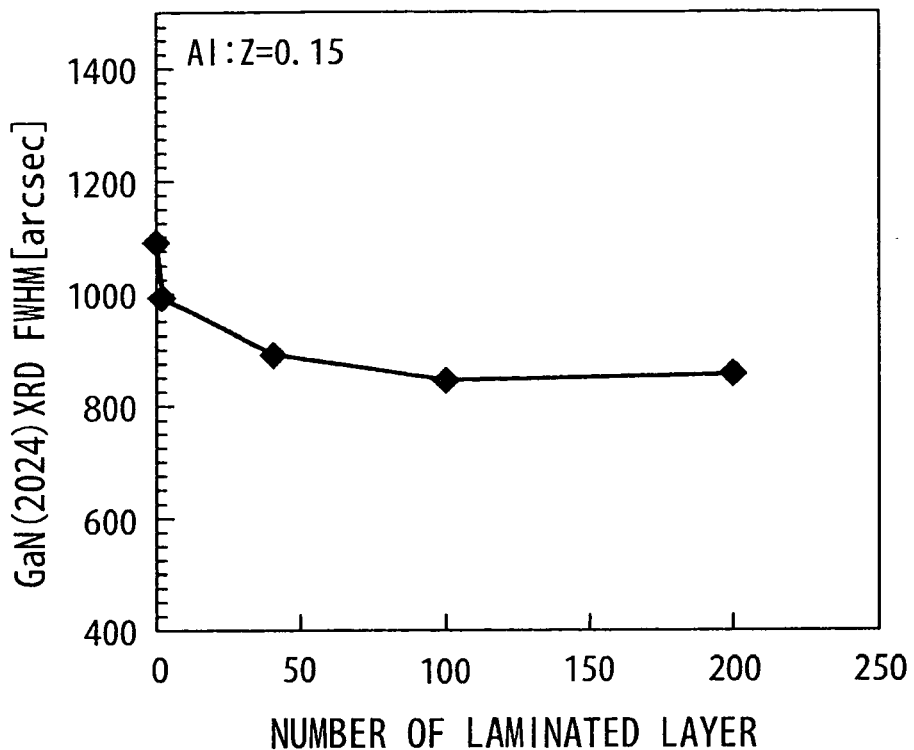
FIG. 3 is graphs illustrating a relationship between a total laminating number (0, 2, 40, 100, 200) of an AlN layer and an $Al_{0.15}Ga_{0.85}N$ layer that comprise a superlattice composite layer and the GaN layer: (a) illustrates a relationship between the total laminating number of the AlN layer and the $Al_{0.15}Ga_{0.85}N$ layer that comprise the superlattice composite layer and the half bandwidth of the X-ray diffraction of the GaN layer: and (b) illustrates a relationship between the total laminating number of the AlN layer and the $Al_{0.15}Ga_{0.85}N$ layer that comprise the superlattice composite layer and the number of pits generated in the unit dimension of the GaN layer.
Figure 3:
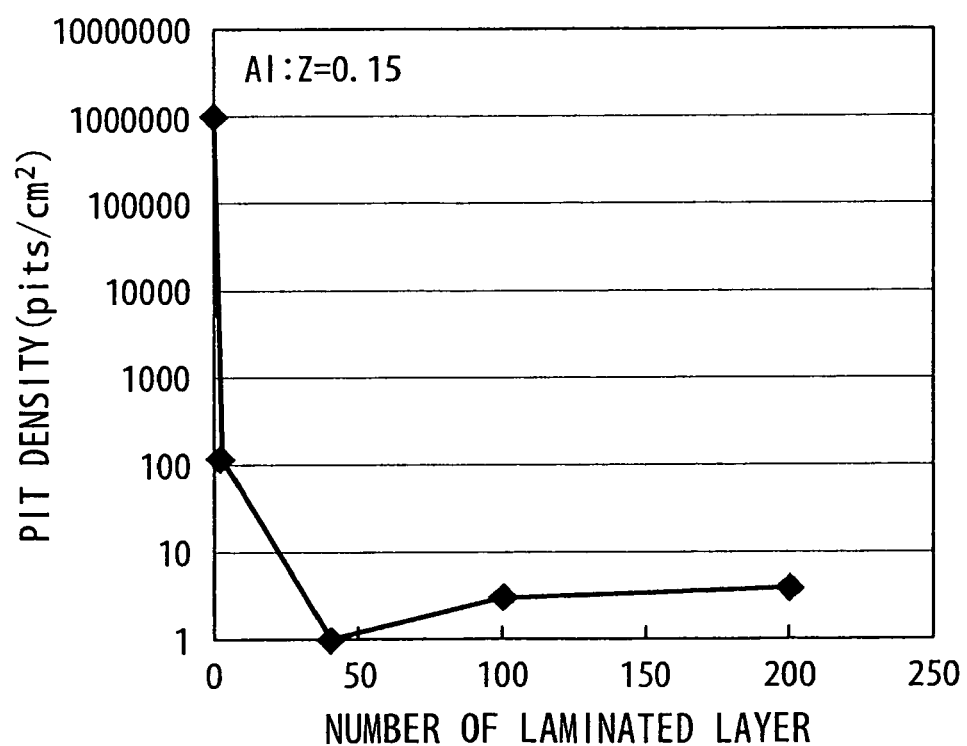

Here, FIG. 3(a) is a graph showing a relationship between a total number of laminated layers of the AlN layer and $Al_{0.15}Ga_{0.85}N$ layer comprising the superlattice composite layer 40 and the crystalline property (the half bandwidth of the X-ray diffraction) of the GaN layer the value of Z of the low AlN containing layer 42 and the crystalline property of the GaN layer, with regard to the semiconductor material 1 comprising, as shown in FIG. 1: the AlN layer having the film thickness of 100 nm as the interlayer 20 formed on the Si substrate 10; the composition graded layer 30, formed on the AlN layer, having the film thickness of 3.5 μm and the composition $Al_xGa_{1-x}N$ with the value of X to change continuously from X=1 to X=0; the superlattice composite layer 40, formed on the composition graded layer 30, comprising one of five different total laminating numbers of the layers (0 layer, 2 layers, 20 layers, 40 layers, 100 layers and 200 layers) of the AlN layer having the film thickness of 5 μm as the high Al-containing layer 41 and the $Al_{0.15}Ga_{0.85}N$ layer having the film thickness of 20 nm as the low Al-containing layer 42 that are laminated alternately; and the GaN layer, formed on the superlattice composite layer 40, having the film thickness of 1 μm as the nitride semiconductor layer 50. FIG. 3(b) is a graph showing a relationship between the total laminating number of the AlN layer and the $Al_{0.15}Ga_{0.85}N$ layer comprising the superlattice composite layer 40 and the number of pits in the unit dimension (1 $cm^2$) of the GaN layer, with regard to such a semiconductor material 1. As obvious from FIG. 3(a) and FIG. 3 (b), if the total laminating number is 2 or more, the crystalline property dramatically improves (the half bandwidth becomes large) (FIG. 3(a)) and the number of pits is significantly curbed (FIG. 3(b)). Although it produced a good crystalline character and the number of pits was curbed when the total laminating number was 200, the crack was generated. Accordingly, it is preferable that the total laminating number of the high Al-containing layer 41 and the low Al-containing layer 42 in the superlattice composite layer 40 is 2 to 100.

In addition, although the film thicknesses of the high Al-containing layer 41 and the low Al-containing layer 42 are not particularly limited, it may not effectively mitigate the stress resulting from the difference from the coefficient of thermal expansion of the Si substrate 10 if the film thickness is too thin, whereas it may cause lattice relaxation during growth of the high Al-containing layer 41 or the low Al-containing layer 42, causing increase of the pits, if the film thickness it too thick. Accordingly, it is preferable that the film thickness of the high Al-containing layer 41 is 1 to 30 nm and the film thickness of the low Al-containing layer 42 is 5 to 80 nm. It is to be noted that, in FIG. 1, the high Al-containing layer 41 and the low Al-containing layer 42 are thicker than actual ratios thereof, for clearness of a configuration of the superlattice composite layer 40.

(Nitride Semiconductor Layer)

The nitride semiconductor layer 50 according to the present invention, as shown in FIG. 1, is a layer formed on the superlattice composite layer 50. Types of the nitride semiconductor are, for example, GaN, $Al_XGa_{1-X}N$, $In_XGa_{1-X}N$, $Al_X In_Y Ga_{1-X-Y}N$ and the likes.

In addition, the nitride semiconductor layer 50 preferably contains Ga at high density and both Al and In at low content ratios, as it allows high operation speed when used for HEMT, and is preferably the GaN layer.

Since the effect of the present invention curbs generation of the crack and the pit, it enables to obtain the semiconductor material 1 of high quality having the nitride semiconductor layer 50 with a pit density of 1000 pits/cm$^2$ or less (preferably, 200 pits/cm$^2$ or less).

Moreover, it is also possible to provide a cover layer 60 to function as a contact layer, a channel layer, a passivation layer and the likes, if necessary. Types of the cover layer 60 may be, for example, GaN, $Al_XGa_{1-X}N$, $In_XGa_{1-X}N$, $Al_X In_Y Ga_{1-X-Y}N$ and the likes.

It is possible to obtain an excellent semiconductor device without no degradation of a device property caused by the leak current, by using the semiconductor material according to the present invention and providing the semiconductor material with an electrode and the likes.

The following is a description of a method of making the semiconductor material according to the present invention.

The method of making the semiconductor material according to the present invention comprises: forming the composition graded layer, on the Si substrate or the interlayer formed thereon, comprising the composition of $Al_XGa_{1-X}N$ graded such that the content ratio of Al in the composition gradually decreases either continuously or discontinuously in the crystal growing direction; forming the superlattice composite layer, on the composition graded layer, comprising the high Al-containing layer comprising the composition of $Al_Y Ga_{1-Y}N$ ($0.5 \leq Y \leq 1$, preferably Y=1) and the low Al-containing layer comprising the composition of $Al_Z Ga_{1-Z}N$ ($0 \leq Z \leq 0.5$, preferably $0 \leq Z \leq 0.3$) that are laminated alternately such that the total number of laminated layer is preferably 2 to 100; and forming the nitride semiconductor layer on the superlattice composite layer.

Manufacture of the semiconductor material using the method according to the present invention may provide the semiconductor material having the nitride semiconductor layer which generates less generation of the crack and the pit than the conventional semiconductor material and has an excellent crystalline property, as the superlattice composite layer formed on the composition graded layer functions as the buffer layer to prevent generation of the crack and the likes.

It is to be understood that the above descriptions merely exemplify embodiments of the present invention, and thus may be modified in a variety of manners within claims of the present invention.

In addition, although both of the composition graded layer and the superlattice composite layer are AlGaN-based nitrides, the same effects may be expected even if they are AlGaInN-based nitrides.

Next, sample semiconductor materials were produced according to the present invention and capabilities thereof were evaluated.

Embodiment 1

In the embodiment 1, as shown in FIG. 1, the Si substrate 10 of 4 inches in diameter having a crystal face of (111) and a film thickness of 525 um was prepared and heated to 1100 degrees C. using MOCVD method in an atmosphere of hydrogen and nitrogen, and then supplying amounts of trimethylgallium (TMG), trimethylalminium (TMA) and $NH_3$ were adjusted, so as to form an AlN layer as the interlayer 20 having a film thickness of 100 nm. On the AlN layer, the composition graded layer 30 (film thickness 3.5 μm) was formed comprising the composition of $Al_XGa_{1-X}N$ having the Al content ratio X therein which continuously changes from X=1 to X=0 in the crystal growing direction. Subsequently, on the composition graded layer 30, the superlattice composite layer 40 was formed comprising 50 high Al-containing layers 41 (film thickness 5 nm) comprising AlN and 50 low Al-containing layers 42 (film thickness 20 nm) comprising $Al_{0.15}Ga_{0.85}N$ that are laminated alternately, by adjusting supplying amounts of trimethylgallium (TMG), trimethylalminium (TMA) and $NH_3$. Furthermore, a GaN layer 50 having a thickness of 1 μm and an $Al_{0.26}Ga_{0.74}N$ layer 60, which was thin, were sequentially formed on the superlattice composite layer 40. The sample semiconductor material was thus produced.

Embodiment 2

In the embodiment 2, a sample semiconductor material was produced in the same manner as that in the embodiment 1, except for that the superlattice composite layer 40 was formed by 20 high Al-containing layers 41 (film thickness 5 nm) comprising AlN and 20 low Al-containing layers 42 (film thickness 20 nm) comprising GaN that were laminated alternately such that the total number of the laminated layer was 40.

Embodiment 3

In the embodiment 3, a sample semiconductor material was produced in the same manner as that in the embodiment 1, except for that the superlattice composite layer 40 was formed by a single high Al-containing layer 41 (film thickness 5 nm) comprising AlN and a single low Al-containing layer 42 (film thickness 20 nm) comprising $Al_{0.15}Ga_{0.85}N$ that were laminated alternately such that the total number of the laminated layer was 2.

Comparative Example 1

Figure 4:
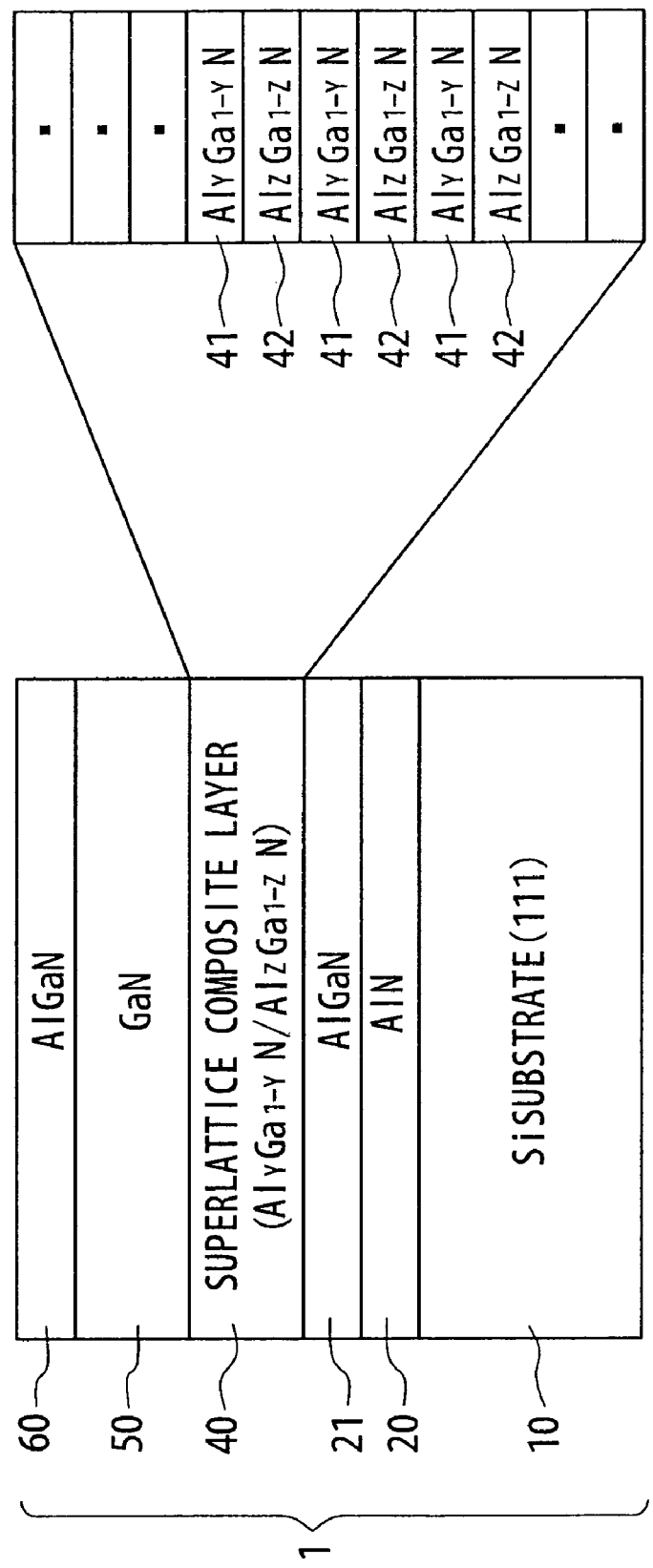
FIG. 4 is a cross sectional view of the semiconductor material produced in a comparative example 1.

In the comparative example 1, as shown in FIG. 4, a sample semiconductor material was produced under the same condition as that of the semiconductor material shown in FIG. 1, by forming: a first interlayer 20 comprising AlN on the Si substrate 10; a second interlayer 21 comprising AlGaN on the first interlayer 20; the superlattice composite layer 40, without forming the composition graded layer 30 on the second interlayer 21, comprising 160 high Al-containing layers 41 (film thickness 5 nm) comprising AlN and 160 low Al-containing layers 42 (film thickness 20 nm) comprising $Al_{0.15}Ga_{0.85}N$ that were laminated alternately such that the total number of the laminated layer was 320; and the GaN layer of 1 μm in thickness and the $Al_{0.26}Ga_{0.74}N$ layer 60 sequentially.

Comparative Example 2

Figure 5:
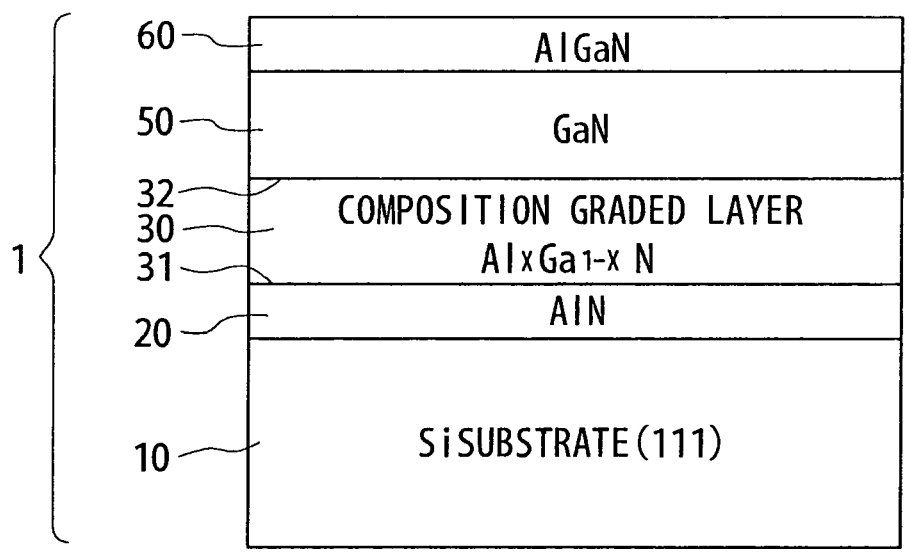
FIG. 5 is a cross sectional view of the semiconductor material produced in a comparative example 2.

In the comparative example 2, as shown in FIG. 5, a sample semiconductor material was produced under the same condition as that of the semiconductor material shown in FIG. 1, by forming the interlayer 20 comprising AlN on the Si substrate 10 and then forming the composition graded layer 30 on the interlayer 20. Subsequently, without forming the superlattice composite layer 40 on the composition graded layer 30, the GaN layer of 1 μm in thickness and the $Al_{0.26}Ga_{0.74}N$ layer 60 was sequentially formed on the composition graded layer 30.

Each semiconductor material produced in the above embodiments and comparative examples were evaluated. The followings are evaluation methods.

(Evaluation Method)
(1) The Number of Pits

A surface of the GaN layer 50 of the semiconductor material produced in the above embodiments and the comparative examples was observed using an optical microscope (at 100-fold magnification) so as to measure the number of pits at 5 arbitrary points of the wafer of 4 inches in a view range and to convert the number into the pit density (pits/cm²) to be evaluated based on the following criteria.
  ◯: 1000 pits/cm² or less
  X: over 1000 pits/cm²

(2) Existence of Crack

The surface of the GaN layer 50 of the semiconductor material produced in the above embodiments and the comparative examples was observed using the optical microscope (at 100-fold magnification) so as to observe an existence of the crack to be evaluated based on the following criteria.
  ◯: There is no crack within 5 mm of periphery of wafer of 4 inches
  X: There is the crack(s) within 5 mm of periphery of wafer of 4 inches (3) Crystalline Property A half bandwidth of a diffraction line at a crystal face (2024) of the GaN layer 50 of the semiconductor material produced in the above embodiments and comparative examples was measured using an X-ray diffractometer to be evaluated based on the following criteria.
  ◯: 1200 arcsec or less
  Δ: 1200 arcsec or more and 1300 arcsec or less
  X: over 1300 arcsec Results of the above evaluations (1) to (3) are shown in Table 1.

TABLE 1

| | Composition graded layer ($Al_XGa_{1-X}N$ layer) | Superlattice composite layer | | Total Laminated Layer | Pit | | Crack Evaluation | Crystalline Property | |
|---|---|---|---|---|---|---|---|---|---|
| | | High Al-containing layer ($Al_YGa_{1-Y}N$) | Low Al-containing layer ($Al_ZGa_{1-Z}N$) | | Pit (number) | Evaluation | | Half Bandwidth (arcsec) | Evaluation |
| Embodiment 1 | YES | Al:Y = 1.0 | Al:Z = 0.15 | 100 layers | 3 | ◯ | ◯ | 851.8 | ◯ |
| Embodiment 2 | YES | Al:Y = 1.0 | Al:Z = 0 | 40 layers | 0 | ◯ | ◯ | 1127.3 | ◯ |
| Embodiment 3 | YES | Al:Y = 1.0 | Al:Z = 0.15 | 2 layers | 120 | ◯ | ◯ | 995.6 | ◯ |
| Comparative Example 1 | NO | Al:Y = 1.0 | Al:Z = 0.15 | 160 layers | $5.8 \times 10^5$ | X | ◯ | 1420.5 | X |
| Comparative Example 2 | YES | — | — | 0 layer | $1.1 \times 10^6$ | X | ◯ | 1092.8 | ◯ |

As a result shown in Table 1, although the numbers of cracks of the samples of the embodiments 1, 2 and 3 are not significantly different from those of the samples of the comparative examples 1, 2, the numbers of pits in the embodiments are dramatically less than those in the comparative examples. Also, in comparison of the embodiments 1, 3 with the comparative example 1, each superlattice composite layer thereof having the same amount of Al content, it was found out that, since the half bandwidth in the embodiments is smaller than that in the comparative example, the semiconductor materials in the embodiments can substantially prevent generation of the pits and have excellent crystalline properties.

According to the present invention, it is possible to provide the semiconductor material, having the nitride semiconductor layer which generates less crack and pit than the conventional semiconductor material and has excellent crystalline property, and a method of making such a semiconductor material, as well as a high quality semiconductor device using such a semiconductor material.

The invention claimed is:

1. A semiconductor material comprising:
   a composition graded layer, formed on a Si substrate or an interlayer formed on the Si substrate, comprising a composition of $Al_XGa_{1-X}N$ graded such that a content ratio of Al in the composition decreases continuously or discontinuously in a crystal growing direction;
   a superlattice composite layer, formed on the composition graded layer, comprising a high-Al-containing layer comprising a composition of $Al_YGa_{1-Y}N$ ($0.5 \leq Y \leq 1$) and a low Al-containing layer comprising a composition $Al_ZGa_{1-Z}N$ ($0 \leq Z \leq 0.5$) that are laminated alternately; and
   a nitride semiconductor layer formed on the superlattice composite layer.

2. The semiconductor material according to claim 1, wherein the superlattice composite layer comprises an AlN layer (Y=1) as the high Al-containing layer and an $Al_ZGa_{1-Z}N$ layer ($0 \leq Z \leq 0.3$) as the low Al-containing layer.

3. The semiconductor material according to claim 1, wherein a total number of the high Al-containing layer and the low Al-containing layer is 2 to 100 in the superlattice composite layer.

4. The semiconductor material according to claim 1, wherein the superlattice composite layer comprises the high Al-containing layer as a bottom layer thereof and the low Al-containing layer as a top layer.

5. The semiconductor material according to claim 1, wherein, in the graded layer, a value of X in $Al_XGa_{1-X}N$ is in a range of 0.5 to 1 at a lower surface in contact with the Si substrate or the interlayer and in a range of 0 to 0.5 at an upper surface in contact with the superlattice composite layer.

6. The semiconductor material according to claim 1, wherein the nitride semiconductor layer is a GaN layer.

7. The semiconductor material according to claim 6, wherein a pit density of the GaN layer is 1000 pits/cm$^2$ or less.

8. A semiconductor device produced by using the semiconductor material according to claim 1 provided with an electrode.

9. A method of making a semiconductor material comprising:
   forming a composition graded layer, on a Si substrate or an interlayer formed on the Si substrate, comprising a composition of $Al_XGa_{1-X}N$ graded such that a content ratio of Al in the composition decreases continuously or discontinuously in a crystal growing direction
   forming a superlattice composite layer, on the composition graded layer, comprising a high Al-containing layer comprising a composition of $Al_YGa_{1-Y}N$ ($0.5 \leq Y \leq 1$) and a low Al-containing layer comprising a composition $Al_ZGa_{1-Z}N$ ($0 \leq Z \leq 0.5$) that are laminated alternately; and
   forming a nitride semiconductor layer on the superlattice composite layer.

10. The method of making the semiconductor material according to claim 9, wherein a process to form the superlattice composite layer is to form an AlN layer as the high Al-containing layer and to form an $Al_ZGa_{1-Z}N$ layer ($0 \leq Z \leq 0.3$) as the low Al-containing layer.

11. The method of making the semiconductor material according to claim 9, wherein the process to form the superlattice composite layer is to laminate the high Al-containing layer and the low Al-containing layer such that a total number thereof is 2 to 100.

* * * * *